United States Patent
Tanida et al.

(10) Patent No.: US 9,761,463 B2
(45) Date of Patent: Sep. 12, 2017

(54) SEMICONDUCTOR DEVICE AND SEMICONDUCTOR DEVICE MANUFACTURING METHOD

(71) Applicant: Toshiba Memory Corporation, Minato-ku (JP)

(72) Inventors: Kazumasa Tanida, Oita (JP); Takamitsu Yoshida, Oita (JP); Kuniaki Utsumi, Oita (JP); Atsuko Kawasaki, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/718,435

(22) Filed: May 21, 2015

(65) Prior Publication Data

US 2016/0013099 A1 Jan. 14, 2016

(30) Foreign Application Priority Data

Jul. 8, 2014 (JP) .................. 2014-140390

(51) Int. Cl.
*H01L 21/768* (2006.01)
*H01L 21/283* (2006.01)
(Continued)

(52) U.S. Cl.
CPC ...... *H01L 21/4853* (2013.01); *H01L 25/0657* (2013.01); *H01L 25/18* (2013.01);
(Continued)

(58) Field of Classification Search
CPC ......... H01L 23/49811; H01L 23/49838; H01L 25/065
See application file for complete search history.

(56) References Cited

U.S. PATENT DOCUMENTS 6,756,305 B1 6/2004 Conn
7,119,439 B2 * 10/2006 Watanabe ......... H01L 21/76802
257/529

(Continued)

FOREIGN PATENT DOCUMENTS

JP 2000-277612 A 10/2000
JP 2001-176872 A 6/2001
(Continued)

OTHER PUBLICATIONS

Korean Office Action issued Feb. 2, 2016 in Patent Application No. 10-2015-0067317 (with English translation).
(Continued)

*Primary Examiner* — Peniel M Gumedzoe
(74) *Attorney, Agent, or Firm* — Oblon, McClelland, Maier & Neustadt, L.L.P.

(57) ABSTRACT

According to embodiments, a semiconductor device is provided. The semiconductor device includes an insulation layer, an electrode, and a groove. The insulation layer is provided on a surface of a substrate. The electrode is buried in the insulation layer, and a first end surface of the electrode is exposed from the insulation layer. The groove is formed around the electrode on the surface of the substrate. The groove has an outside surface of the electrode as one side surface, and the groove is opened on the surface side of the insulation layer. The first end surface of the electrode buried in the insulation layer protrudes from the surface of the insulation layer.

11 Claims, 10 Drawing Sheets

(51) Int. Cl.
*H01L 21/48* (2006.01)
*H01L 23/498* (2006.01)
*H01L 25/065* (2006.01)
*H01L 25/18* (2006.01)
*H01L 25/00* (2006.01)
*H01L 27/146* (2006.01)

(52) U.S. Cl.
CPC ........ *H01L 25/50* (2013.01); *H01L 21/76885* (2013.01); *H01L 27/14634* (2013.01); *H01L 27/14643* (2013.01); *H01L 2225/06513* (2013.01); *H01L 2225/06541* (2013.01); *H01L 2924/0002* (2013.01); *H01L 2924/1431* (2013.01); *H01L 2924/1434* (2013.01)

(56) References Cited

U.S. PATENT DOCUMENTS

| | | | |
|---|---|---|---|
| 7,268,434 B2* | 9/2007 | Nakashima | H01L 21/76808 257/773 |
| 7,750,469 B2* | 7/2010 | Cho | H01L 23/3171 257/738 |
| 7,944,053 B2* | 5/2011 | Usui | H01L 21/7682 257/750 |
| 8,513,058 B2 | 8/2013 | Iwamatsu et al. | |
| 8,766,389 B2 | 7/2014 | Sato | |
| 8,896,125 B2 | 11/2014 | Kagawa et al. | |
| 2004/0017011 A1* | 1/2004 | Narita | H01L 21/76802 257/762 |
| 2004/0129938 A1* | 7/2004 | Landers | H01L 22/34 257/48 |
| 2004/0183759 A1* | 9/2004 | Stevenson | G02B 6/43 345/82 |
| 2007/0170584 A1* | 7/2007 | Chatterjee | H01L 21/76885 257/734 |
| 2008/0042128 A1* | 2/2008 | Furukawa | H01L 51/0512 257/40 |
| 2011/0186936 A1 | 8/2011 | Iwamatsu et al. | |
| 2012/0217650 A1 | 8/2012 | Imai | |
| 2013/0009321 A1* | 1/2013 | Kagawa | H01L 23/481 257/774 |
| 2013/0161813 A1* | 6/2013 | Miki | H01L 23/49811 257/737 |
| 2013/0256897 A1 | 10/2013 | Takemoto et al. | |

FOREIGN PATENT DOCUMENTS

| | | |
|---|---|---|
| JP | 2007-059916 A | 3/2007 |
| JP | 2009-524932 A | 7/2009 |
| JP | 2011-159889 A | 8/2011 |
| JP | 2012-156231 | 8/2012 |
| JP | 2013-033786 | 2/2013 |
| JP | 2013-211474 | 10/2013 |
| TW | 200949931 A1 | 12/2009 |
| TW | 201101439 A1 | 1/2011 |

OTHER PUBLICATIONS

Grzegorz Deptuch et al. "Vertically Integrated Circuits at Fermilab", IEEE Nuclear Science Symposium Conference Record, 2009, 9 pages.

Office Action issued Aug. 9, 2016 in Taiwanese Patent Application No. 104112708 (with English language translation).

* cited by examiner

SEMICONDUCTOR DEVICE AND SEMICONDUCTOR DEVICE MANUFACTURING METHOD

CROSS-REFERENCE TO RELATED APPLICATIONS

This application is based upon and claims the benefit of priority from Japanese Patent Application No. 2014-140390, filed on Jul. 8, 2014; the entire contents of which are incorporated herein by reference.

FIELD

Embodiments described herein relate generally to a semiconductor device and a semiconductor device manufacturing method.

BACKGROUND

Formerly, there is a technique of reducing the occupied area of a semiconductor device by sticking multi-stage chips each having semiconductor elements and an integrated circuit formed thereon to a substrate. An insulation layer is provided on each sticking plane of chips stuck, and a plurality of electrodes connected by sticking chips together are provided in corresponding positions of respective insulation layers. Such chips are polished to become flat in sticking surfaces, and then stuck.

In a process of polishing sticking surfaces of respective chips, however, a sticking surface of an insulation layer and a sticking surface of an electrode are not flush with each other in some cases. In such a case, a faulty joint occurs in a joint portion between chips, resulting in a lowered yield.

BRIEF DESCRIPTION OF THE DRAWINGS

FIGS. 8A to 9C are explanation diagrams illustrating manufacture processes of the semiconductor device according to the first embodiment;

DETAILED DESCRIPTION

According to the present embodiments, a semiconductor device is provided. The semiconductor device includes an insulation layer, an electrode, and a groove. The insulation layer is provided on a surface of a substrate. The electrode is buried in the insulation layer, and has a first end surface exposed from the insulation layer. The groove is formed around the electrode on the substrate surface.

Hereafter, semiconductor devices and semiconductor device manufacturing methods according to the embodiments will be described in detail with reference to the accompanying drawings. By the way, the present invention is not restricted to these embodiments. Furthermore, in the ensuing description, the case where the semiconductor device is a solid state imaging device is taken as an example. However, semiconductor devices according to the embodiments are not restricted to solid state imaging devices.

(First Embodiment)

Figure 1:
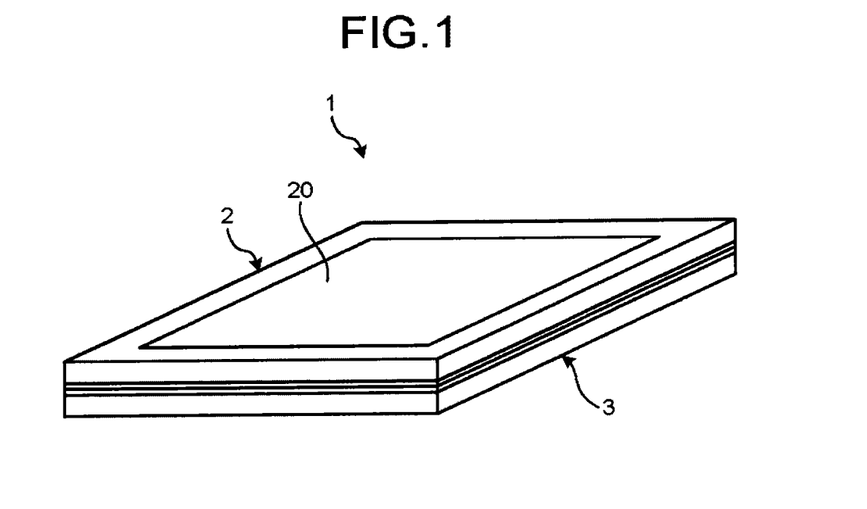
FIG. 1 is an explanation diagram illustrating an oblique view of a semiconductor device according to a first. embodiment.
Figure 2:
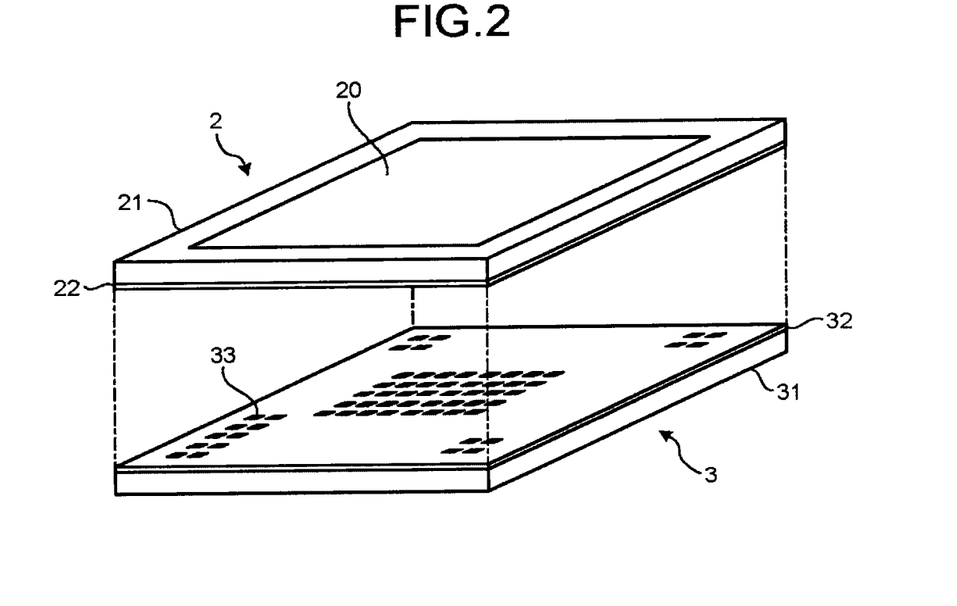
FIG. 2 is an exploded oblique view of the semiconductor device illustrated in FIG. 1.

FIGS. 1 and 2 are explanation diagrams illustrating an oblique view of a semiconductor device 1 according to a first embodiment. FIG. 2 is an exploded oblique view of the semiconductor device 1 illustrated in FIG. 1. As illustrated in FIG. 1, the semiconductor device 1 includes a first chip 2 and a second chip 3 stuck to each other.

The first chip 2 is, for example, a sensor chip including a CMOS (Complementary Metal Oxide Semiconductor) image sensor 20 to pick up an image of a subject. The second chip 3 is, for example, a logic chip including a logic circuit to read out an image signal of an image picked up from the CMOS image sensor 20 and conduct various kinds of signal processing on the image signal read out.

By the way, the semiconductor device 1 may have a configuration in which a first logic chip and a second logic chip are stuck together, or may have a configuration in which a logic chip and a memory chip are stuck together. The semiconductor device 1 may have a configuration in which at least three chips are stuck together.

As illustrated in FIG. 2, the second chip 3 includes a substrate 31 on which a logic circuit and so forth are provided, an insulation layer 32 provided on a top surface of the substrate 31, and a plurality of electrodes 33 buried in the insulation layer 32 and having first end surfaces exposed from the insulation layer 32. The respective electrodes 33 are connected to the logic circuit and so forth via, for example, wiring lines in the substrate 31.

On the other hand, the first chip 2 includes a substrate 21 on which the CMOS sensor 20 and so forth are provided, an insulation layer 22 provided on a bottom surface of the substrate 21, and a plurality of corresponding electrodes buried in positions in the insulation layer 22 corresponding to the electrodes 33 of the second chip 3 and having first end surfaces exposed from the insulation layer 22. The respective corresponding electrodes are connected to, for example, the CMOS sensor 20 and so forth via wiring lines in the substrate 21.

As for the first chip 2 and the second chip 3, respective sticking surfaces are polished and flattened, and then the sticking surfaces are stuck together directly without using a bonding agent. As a result, the first chip 2 and the second chip 3 are tentatively joined by hydrogen bond caused by intermolecular force between the insulation layers 22 and 32. Then, the first chip 2 and the second chip 3 undergo heat treatment. As a result, the first chip 2 and the second chip 3 are formerly joined by covalent bond between the insulation layers 22 and 32.

In this way, it is possible in the semiconductor device 1 to connect corresponding electrodes provided on the bottom surface of the CMOS image sensor 20 included in the first chip 2 to the electrodes 33 provided on the top surface of the second chip 3. For example, therefore, the logic circuit included in the second chip 3 can read out a signal from directly under the CMOS image sensor 20, and consequently it becomes possible to reduce the occupied area of the chip.

When the sticking surface of the first chip 2 is polished in the semiconductor device 1, the sticking surface of the insulation layer 22 and the sticking surface of the corresponding electrodes are not flush with each other in some cases. In the same way, in the second chip 3 as well, when sticking surfaces are polished, the sticking surface of the insulation layer 32 and the sticking surface of the electrodes 33 are not flush with each other in some cases.

If the corresponding electrodes of the first chip 2 protrude from the joining surface of the insulation layer 22, when the first chip 2 and the second chip 3 are stuck together, joining portions between the electrodes 33 and the corresponding electrodes are pushed out in the surface direction of the joining surface and sandwiched between surrounding insulation layers 22 and 32 in some cases.

In the case where the pushed out portions of the electrodes 33 and the corresponding electrodes are sandwiched between the insulation layers 22 and 32 in this way, portions that are riot yet joined called voids are generated between the insulation layers 22 and 32. There is a fear that the first chip 2 will be peeled off from the second chip 3 because of the voids, resulting in a lowered yield of the semiconductor device 1.

In the semiconductor device 1, therefore, it was made possible to improve the yield by contriving shapes of the sticking surfaces of the first chip 2 and the second chip 3. Such shapes of joining portions in the first chip 2 and the second chip 3 will now be described with reference to FIGS. 3 and 4.

By the way, configurations of the sticking surfaces of the first chip 2 and the second chip 3 are similar. The shape of the sticking surface in the second chip 3 will now be described, and description concerning the first chip 2 will be omitted.

Figure 3:
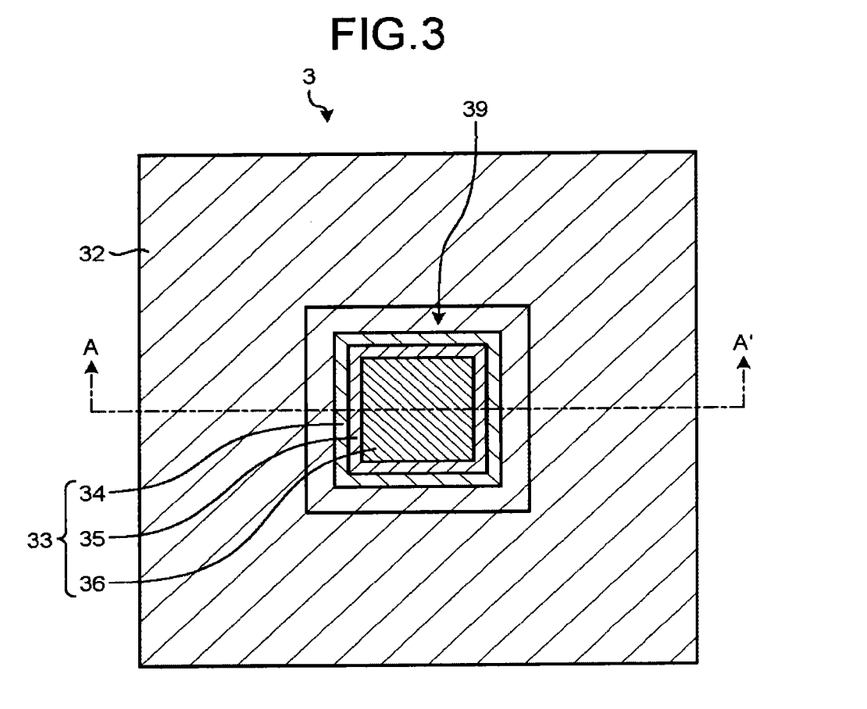
FIG. 3 is an explanation diagram illustrating a plane view of an electrode portion of a second chip according to the first embodiment.
Figure 4:
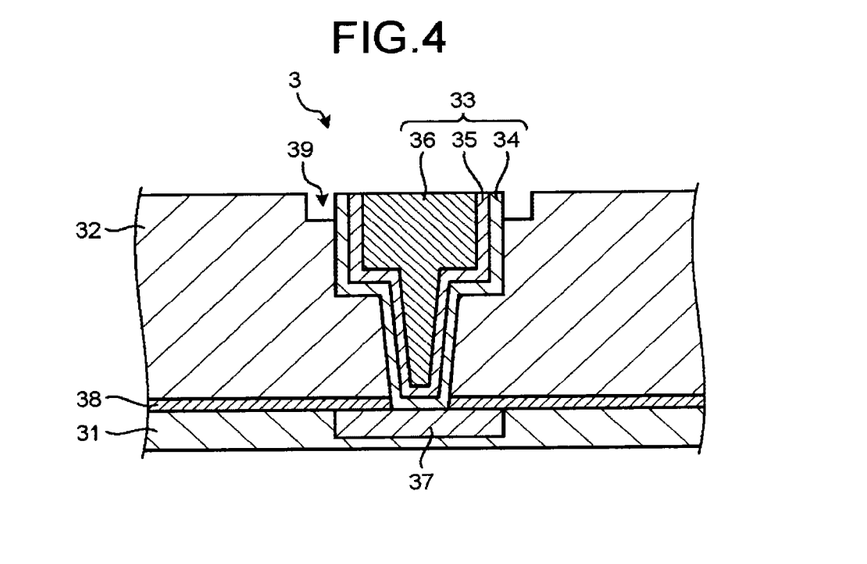
FIG. 4 is an explanation diagram illustrating a schematic sectional view of the second chip along an A-A' line in FIG. 3.

FIG. 3 is an explanation diagram illustrating a plane view of an electrode 33 portion of the second chip 3 according to the embodiment. FIG. 4 is an explanation diagram illustrating a schematic sectional view of the second chip 3 along an A-A' line illustrated in FIG. 3. FIG. 4 selectively illustrates a portion on the top surface of the substrate 31 where the insulation layer 32 is provided. As for other portions, illustration is omitted.

As illustrated in FIGS. 3 and 4, the second chip 3 includes the electrode 33 buried in the insulation layer 32 and having the first end surface exposed from the insulation layer 32. An outside surface and a bottom surface of the electrode 33 are formed of barrier metal 34. An inner circumference surface of the barrier metal 34 is covered by a seed film 35. A contact plug 36 formed of a conductive material is provided in a space covered by the seed film 35. The electrode 33 has such a structure.

As illustrated in FIG. 4, the electrode 33 is connected to a wiring line 37 provided in the substrate 31, and connected to, for example, the logic circuit or the like via the wiring line 37. By the way, an insulation film 38 is provided between the substrate 31 and the insulation film 32 except a connection portion between the electrode 33 and the wiring line 37.

Furthermore, the second chip 3 includes a groove 39, which has an outside surface of the electrode 33 as one side surface, which is opened on the surface side of the insulation layer 32, and which surrounds the electrode 33 in an annular form as illustrated in FIGS. 3 and 4. Even if the corresponding electrodes of the first chip 2 protrude from the joining surface of the insulation layer 22, therefore, it is possible in the semiconductor device 1 to suppress sandwiching. In other words, it is possible to suppress the joining portions between the electrodes 33 and the corresponding electrodes that are sandwiched between surrounding insulation layers 22 and 32 when sticking the first chip 2 and the second chip 3 together. This point will now be described with reference to FIGS. 5 and 6.

Figure 5:
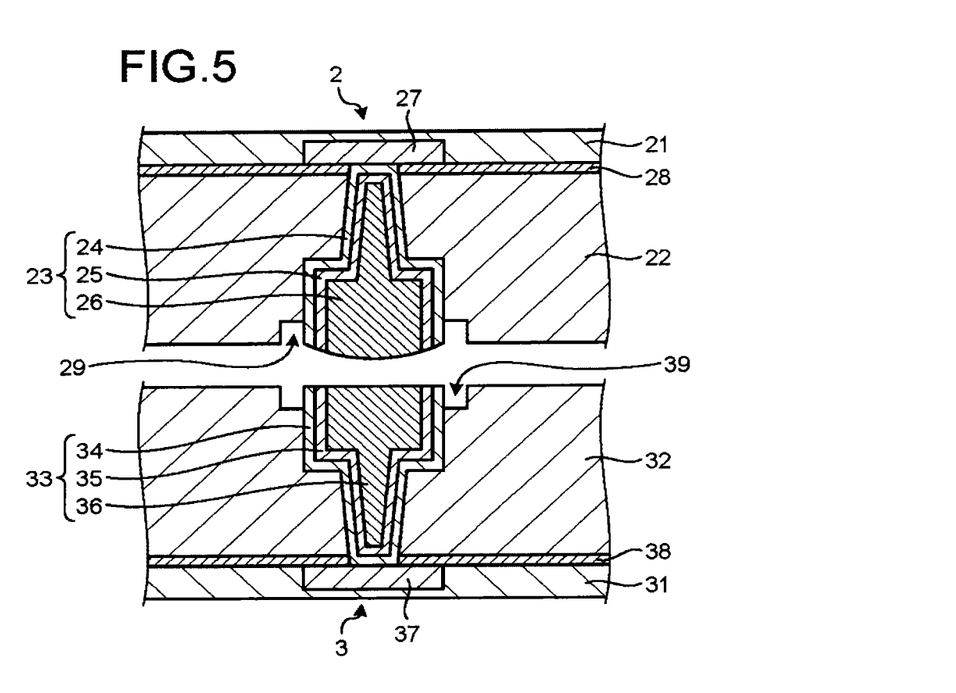
FIG. 5 is an explanation diagram illustrating schematic sectional views of a first chip and the second chip before sticking according to the first embodiment.
Figure 6:
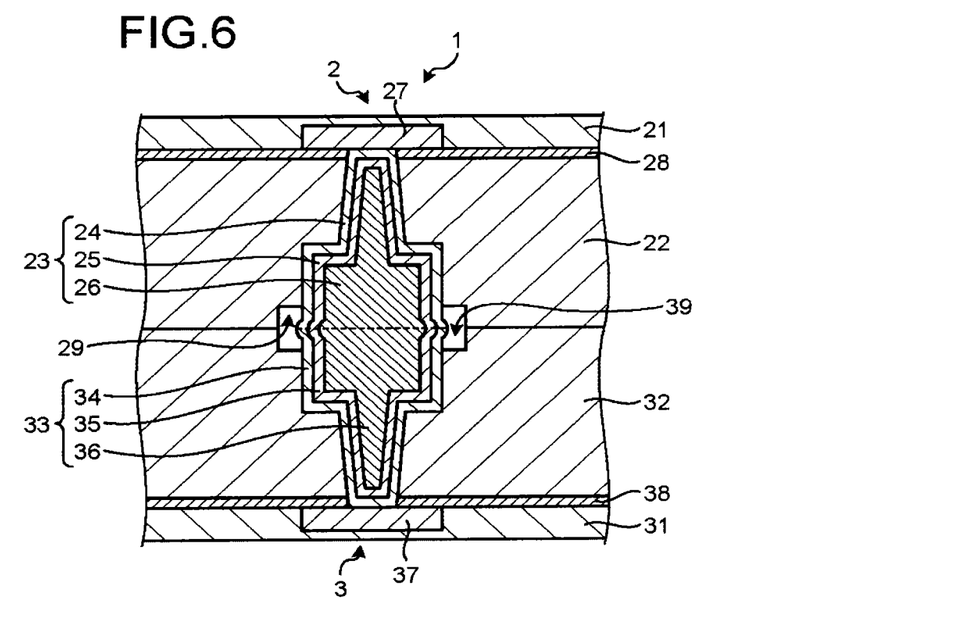
FIG. 6 is an explanation diagram illustrating schematic sectional views of the first chip and the second chip after sticking according to the first embodiment.

FIG. 5 is an explanation diagram illustrating schematic sectional views of the first chip 2 and the second chip 3 before sticking according to the first embodiment. FIG. 6 is an explanation diagram illustrating schematic sectional views of the first chip 2 and the second chip 3 after sticking according to the first embodiment.

A case where the corresponding electrode 23 in the first chip 2 protrudes from the joining surface of the insulation layer 22 will now be described as an example. By the way, the second chip 3 illustrated in FIG. 5 is the same as that illustrated in FIG. 4. Therefore, description of the second chip 3 will be omitted by providing reference numerals similar to those illustrated in FIG. 4.

As illustrated in FIG. 5, a sticking surface portion of the first chip 2 has a configuration similar to that of the sticking surface portion of the second chip 3. A wiring line 27 is provided within the substrate 21, and the insulation layer 22 is provided on the bottom surface of the substrate 21. Furthermore, the corresponding electrodes 23 are provided in positions in the insulation layer 22 corresponding to the electrodes 33 in the second chip 3. By the way, an insulation film 28 is provided between the substrate 21 and the insulation layer 22 except connection portions between the corresponding electrodes 23 and the wiring line 27.

In the same way as the electrode 33 in the second chip 3, an outside surface and a bottom surface of the corresponding electrode 23 are formed of barrier metal 24. An inner circumference surface of the barrier metal 24 is covered by a seed film 25. A contact plug 26 is provided in a space covered by the seed film 25. The corresponding electrode 23 has such a structure. Furthermore, the first chip 2 includes a groove 29 which has an outside surface of the corresponding electrode 23 as one side surface, which is opened on the surface side of the insulation layer 22, and which surrounds the corresponding electrode 23 in an annular form, in the same way as the second chip 3.

When sticking the first chip 2 and the second chip 3 together, first, the first chip 2 is disposed over the second chip 3 to be opposed to the second chip 3 and position alignment is conducted to position the corresponding electrode 23 in the first chip 2 over the electrode 33 in the second chip 3.

At this time, in the first chip 2, the corresponding electrode 23 is not polished sufficiently due to, for example, composition or the like of slurry used in polishing and the corresponding electrode 23 protrudes from the sticking surface of the insulation layer 22 in some cases. If in this state the first chip 2 is stuck to the second chip 3, a joining portion between the corresponding electrode 23 and the electrode 33 is pushed out in the surface direction of the joining surface in some cases as illustrated in FIG. 6 because the corresponding electrode 23 protrudes from the insulation layer 22.

If in such a case there are not the grooves 29 and 39 respectively in the insulation layers 22 and 32, the joining portions of the corresponding electrode 23 and the electrode 33 pushed out are sandwiched between the insulation layers 22 and 32 and formed voids cause inferior joining and chip peeling off.

In the semiconductor device 1, therefore, the groove 39 is provided around the electrode 33 and the groove 29 is provided around the corresponding electrode 23. As a result, in the semiconductor device 1, spaces in the grooves 29 and 39 become refuges of the joining portions of the corresponding electrode 23 and the electrode 33 pushed out.

According to the semiconductor device 1, therefore, the yield can be improved by suppressing chip peeling off due to voids and inferior joining which are caused by sandwiching the joining portion of the corresponding electrode 23 and the electrode 33 pushed out, between the insulation layers 22 and 32.

Figure 7:
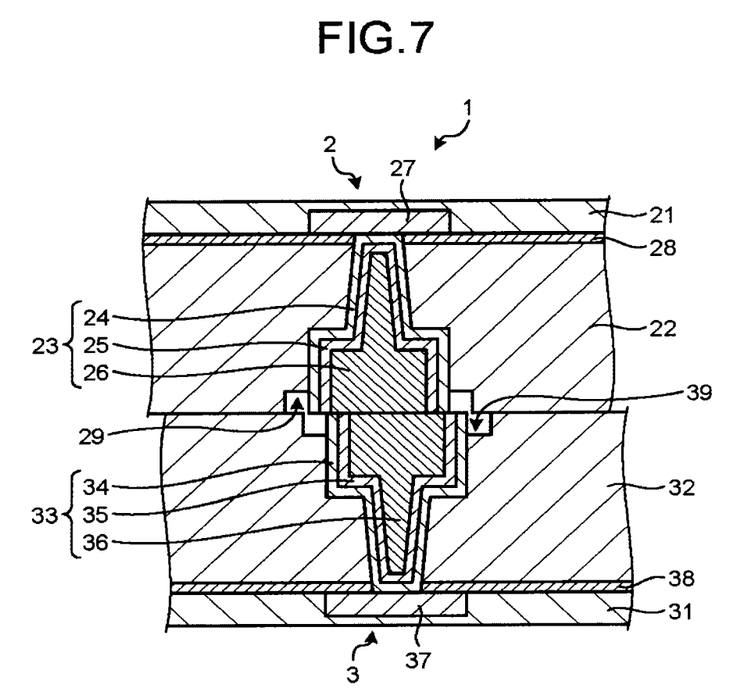
FIG. 7 is an explanation diagram illustrating a state in which alignment deviation has occurred between the first chip and the second chip according to the first embodiment.

Furthermore, in the semiconductor device 1, the above-described grooves 29 and 39 are provided. Even if some alignment deviation occurs between positions of the corresponding electrode 23 and the electrode 33, a current leak can be suppressed. Such a point will now be described with reference to FIG. 7. FIG. 7 is an explanation diagram illustrating a state in which alignment deviation has occurred between the first chip 2 and the second chip 3 according to the first embodiment.

It is now supposed that alignment deviation occurs between the corresponding electrode 23 and the electrode 33 in the semiconductor device 1. If the deviation quantity is equal to or less than the width of the grooves 29 and 39 as illustrated in FIG. 7, the contact plug 26 and the seed film 25 in the first chip 2 do riot come into contact with the insulation layer 32 in the second chip 3. In the same way, in the semiconductor device 1, the contact plug 36 and the seed film 35 in the second chip 3 do not come into contact with the insulation layer 22 in the first chip 2.

According to the semiconductor device 1, therefore, it is possible to prevent current leak caused by diffusion of materials of the contact plugs 26 and 36 and the seed films 25 and 35 into the insulation layers 22 and 32 if the position deviation quantity of the corresponding electrode 23 and the electrode 33 is equal to or less than the width of the grooves 29 and 39.

For preventing contact of the corresponding electrode 23 with the insulation layer 32 in the second chip 3 and contact of the electrode 33 with the insulation layer 22 in the first chip 2, it is desirable to set the width of the grooves 29 and 39 in the range of 0.2 to 5 micron, although it also depends upon the size of the electrode 33 and the corresponding electrode 23. As a result, it is possible to prevent the current leak while suppressing increase of the area of the chip.

A manufacturing method of the semiconductor device 1 according to the first embodiment will now be described with reference to FIGS. 8A to 9C. FIGS. 8A to 9C are explanation diagrams illustrating manufacture processes of the semiconductor device 1 according to the first embodiment. Here, manufacture processes provided to form the portion of the electrode 33 in the second chip 3 will be described. By the way, manufacture processes provided to form the portion of the corresponding electrode 23 in the first chip 2 are similar to the manufacture processes provided to form the electrode 33.

Figure 8A:
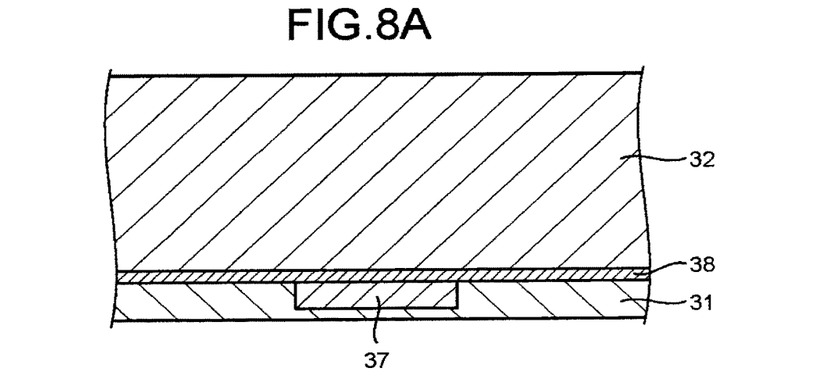

When forming the portion of the electrode 33 in the second chip 3, the substrate 31 having the wiring line 37, the logic circuit, and so forth formed therein is prepared as illustrated in FIG. 8A. When forming the portion of the corresponding electrode 23 in the first chip 2, the substrate 21 having the wiring line 27, the CMOS image sensor 20, and so forth formed therein is prepared. The wiring line 37 is, for example, a Cu (copper) wiring line formed by using the damascene method.

Subsequently, the insulation film 38 is formed on the surface of the substrate 31 by using an insulation material such as, for example, silicon nitride. Then, the insulation layer 32 is formed on the surface of the insulation film 38 by using an insulation material such as, for example, TEOS (Tetraethoxysilane).

Figure 8B:
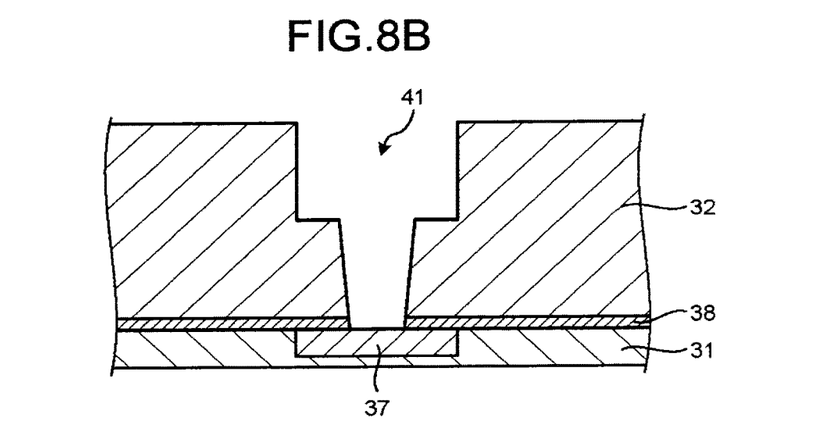

Then, as illustrated in FIG. 8B, an opening 41 is formed in a forming position of the electrode 33 in the insulation layer 32. The opening 41 is formed by first forming a hole having nearly the same opening area as the sticking surface of the electrode 33 formed later, in a surface portion of the insulation layer 32 and then forming a via extending from a center of a bottom surface of the hole to the top surface of the wiring line 37.

Figure 8C:
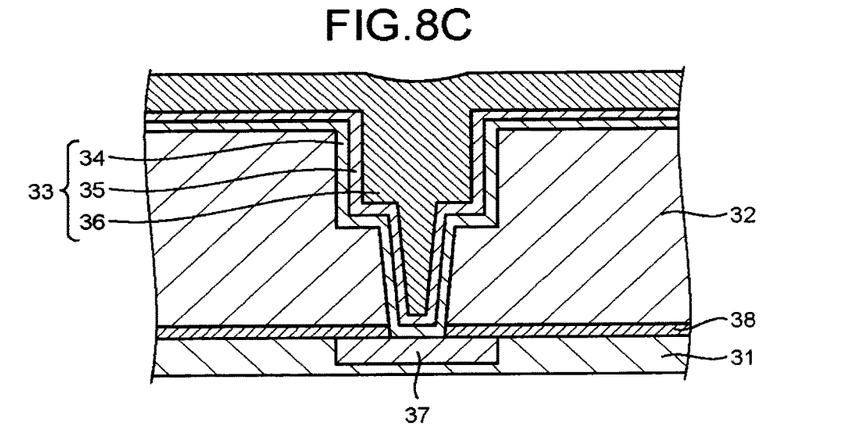

Subsequently, as illustrated in FIG. 8C, a film of the barrier metal 34 is formed on the inner circumference surface of the opening 41 and the top surface of the insulation layer 32 by using a conductive material such as, for example, Ta (tantalum), TaN (tantalum nitride), Ti (titanium), or TiW (titanium tungsten).

Then, the seed film 35 for plating is formed on a surface of the barrier metal 34 by using a conductive material such as, for example, Cu. Then, Cu is caused to deposit on the surface of the seed film 35 by electrolytic plating to form the contact plug 36. As a result, the electrode 33 is formed. By the way, the material of the seed film 35 and the contact plug 36 is not restricted to Cu, but the material may be metal other than Cu.

Figure 9A:
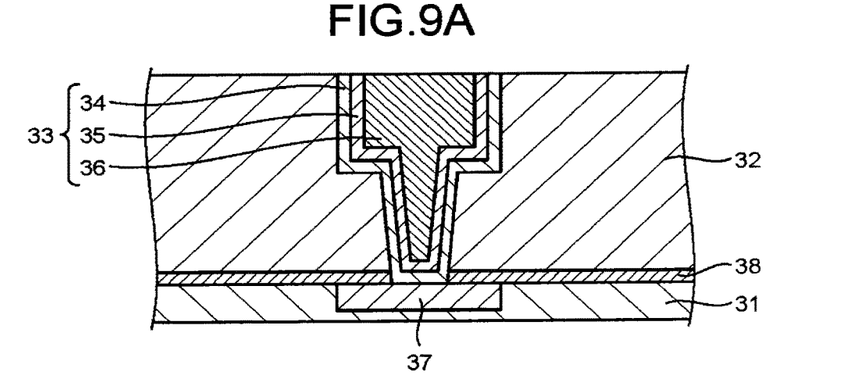

Subsequently, as illustrated in FIG. 9A, unnecessary Cu on the insulation layer 32 and the electrode 33 is removed by, for example, CMP (Chemical Mechanical Polishing). Then, the barrier metal 34 on the insulation layer 32 is removed and the sticking surfaces of the insulation layer 32 and the electrode 33 are made flush with each other by polishing the surface of the second chip 3 by means of touch up CMP.

Figure 9B:
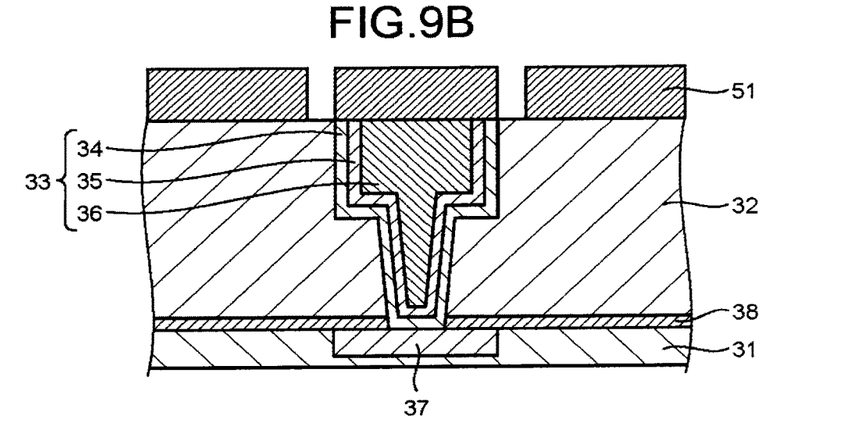
Figure 9C:
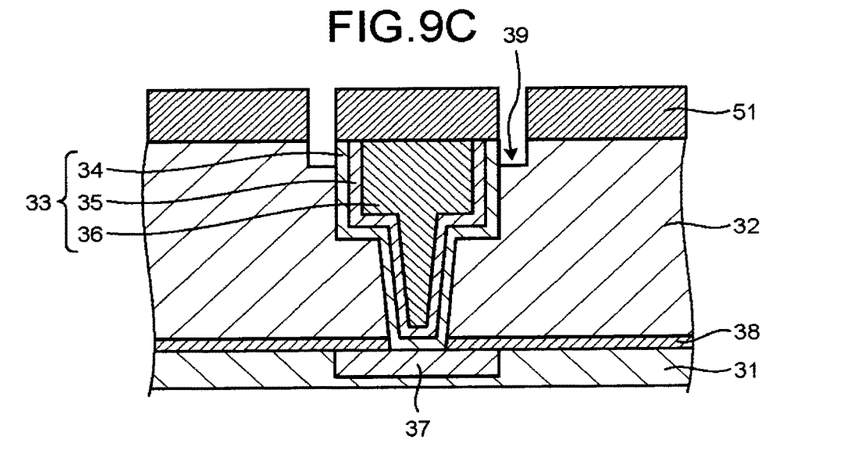

Subsequently, as illustrated in FIG. 9B, a resist 51 is formed on the top surface of the insulation layer 32 and a top surface of the electrode 33 except the forming position of the groove 39. Dry etching is conducted by using the resist 51 as a mask. As a result, the groove 39 is formed as illustrated in FIG. 9C. Finally, the second chip 3 illustrated in FIG. 4 is completed by removing the resist 51. By the way, in a case of condition that the insulation layer 32 is selectively etched, it is not necessary to form the resist 51 on the electrode 33.

In the semiconductor device 1 according to the first embodiment, the insulation layer 32 is provided over the surface of the substrate 31 and the electrode 33 is buried in the insulation layer 32 as described above. In the insulation layer 32, the annular groove 39 is provided to surround the electrode 33.

According to the semiconductor device 1, the yield can be improved by suppressing peeling off of the first chip 2 from the second chip 3 in the case where the electrode 33 in the second chip 3 protrudes from the insulation layer 32 and in the case where the corresponding electrode 23 in the first chip 2 protrudes from the insulation layer 22.

By the way, in the embodiment described above, the case where the grooves 29 and 39 are formed by working the insulation layers 22 and 32 has been described. However, the groove may be formed by working the electrode 33 as in a modification illustrated in FIG. 10.

Figure 10:
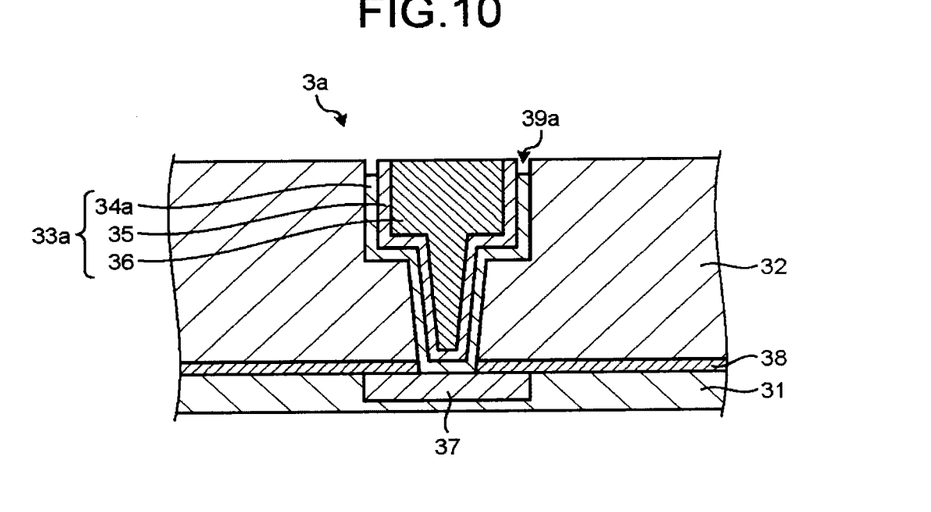
FIG. 10 is an explanation diagram illustrating a schematic sectional view of the second chip according to a modification of the first embodiment.

FIG. 10 is an explanation diagram illustrating a schematic sectional view of a second chip 3a according to a modification of the first embodiment. Among components of the second chip 3a illustrated in FIG. 10, components formed of the same materials as components in the second chip 3 illustrated in FIG. 4 and having the same functions are provided with the same reference numerals as those in FIG. 4 and description of them will be omitted.

The second chip 3a according to the modification differs from the second chip 3 illustrated in FIG. 4 in that a barrier metal 34a is formed of Ti or TiW and a groove 39a is formed by working the barrier metal 34a as illustrated in FIG. 10.

It is also possible to form the groove 39a which has an outside surface of an electrode 33a as one side surface, which is opened on the surface side of the insulation layer 32, and which surrounds the electrode 33a in an annular form by partially removing the barrier metal 34a on a surface side of the second chip 3a without working the insulation layer 32.

In the second chip 3a, the groove 39a formed by working the barrier metal 34a becomes a refuge of the joining portion of the corresponding electrode 23 and the electrode 33a pushed out in the same way as the groove 39 in the second chip 3 illustrated in FIG. 4.

Even if the second chip 3a illustrated in FIG. 10 is applied to the semiconductor device 1 instead of the second chip 3 illustrated in FIG. 4, therefore, the yield can be improved by suppressing the peeling off of a chip in the same way as the semiconductor device 1 illustrated in FIG. 1.

When manufacturing the second chip 3a according to the present modification, manufacture processes similar to the manufacture processes illustrated in FIGS. 8A to 9A are executed. However, the barrier metal 34a is formed of Ti or TiW. Then, wet etching using, for example, fluoric acid is conducted.

At this time, the barrier metal 34a is formed of Ti or TiW. In the wet etching using fluoric acid, therefore, the insulation layer 32, the seed film 35, and the contact plug 36 are not etched, but the barrier metal 34a is etched selectively. As a result, according to the present modification, it is possible to form the groove 39a without using the resist 51 illustrated in FIGS. 9B and 9C.

(Second Embodiment)

A semiconductor device according to a second embodiment will now be described with reference to FIGS. 11 to 13. The semiconductor device according to the second embodiment has the same configuration as that of the semiconductor device 1 according to the first embodiment except that shapes of insulation layers differ from the shapes of the insulation layers 22 and 32 illustrated in FIG. 5.

Furthermore, the insulation layer in the first chip and the insulation layer in the second chip according to the second embodiment have the same shape. Here, therefore, the shape of the second chip according to the second embodiment will be described and description of the first chip will be omitted.

Figure 11:
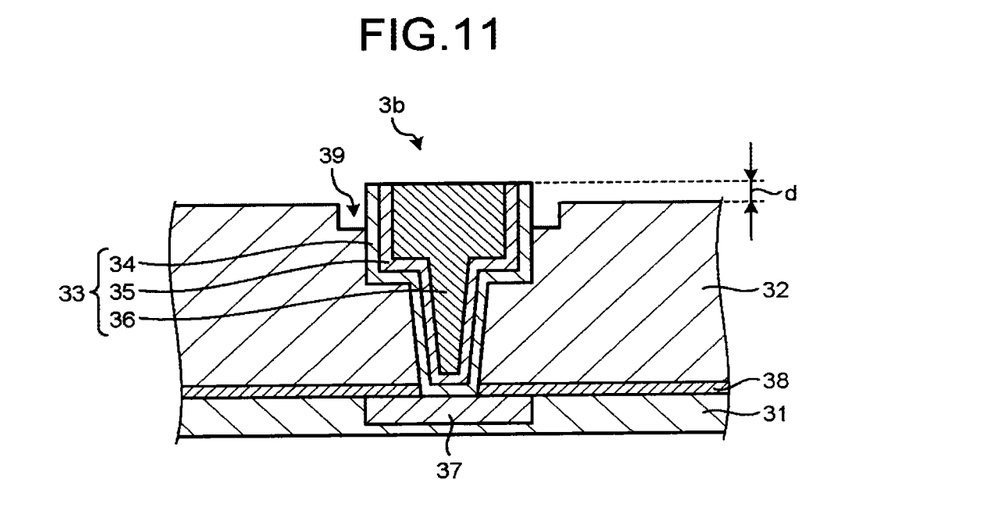
FIG. 11 is an explanation diagram illustrating a schematic sectional view of a second chip according to a second embodiment.

FIG. 11 is an explanation diagram illustrating a schematic sectional view of a second chip 3b according to the second embodiment. FIGS. 12A and 12B are explanation diagrams illustrating a manufacture process of the second chip 3b according to the second embodiment. FIG. 13 is an explanation diagram illustrating schematic sectional views of a first chip 2b and the second chip 3b before sticking according to the second embodiment.

Among components of the second chip 3b illustrated in FIG. 11, components formed of the same materials as components in the second chip 3 illustrated in FIG. 4 and having the same functions are provided with the same reference numerals as those in FIG. 4 and description of them will be omitted.

As illustrated in FIG. 11, the second chip 3b differs from the second chip 3 illustrated in FIG. 4 in that a first end surface which becomes a sticking surface of the electrode 33 protrudes from the surface of the insulation layer 32 by a height d. When manufacturing the second chip 3b, the second chip 3 according to the first embodiment is first prepared as illustrated in FIG. 12A.

Then, a resist 52 is formed on a top surface which becomes a sticking surface of the electrode 33 provided in the first chip 3. Subsequently, as illustrated in FIG. 12B, the sticking surface of the insulation layer 32 and a bottom surface of the groove 39 are caused to retreat in the depth direction of the insulation layer 32 by the thickness d by etching the insulation layer 32 with the resist 52 functioning as a mask. Then, the second chip 3b illustrated in FIG. 11 is completed by removing the resist 52. By the way, in a case of condition that the insulation layer 32 is selectively etched, it is not necessary to form the resist 52 on the electrode 33.

According to the second chip 3b, the electrode 33 can be suitably connected to the corresponding electrode 23 even if the sticking surface of the electrode 33 or the corresponding electrode 23 becomes hollow during manufacture processes. Specifically, as for the first chip 2b, a hollow is caused on the sticking surface of the electrode 23 as illustrated in FIG. 13 in some cases.

Such a hollow is caused, for example, in a case where the corresponding electrode 23 is polished excessively as compared with the insulation layer 22 in a polishing process executed to provide sticking surfaces of the corresponding electrode 23 and the insulation layer 22 with flushness. Even in such a case, according to the second embodiment, the corresponding electrode 23 in the first chip 2b protrudes from the surface of the insulation layer 22 by the height d and the electrode 33 in the second chip 3b protrudes from the surface of the insulation layer 32 by the height d as illustrated in FIG. 13.

Even in a case where the sticking surface of the corresponding electrode 23 is hollowed, therefore, the electrode 33 can be suitably connected to the corresponding electrode 23 by sticking the first chip 2b and the second chip 3b together. Furthermore, the first chip 2b includes the groove 29 in the same way as the first embodiment, and the second chip 3b includes the groove 39 in the same way as the first embodiment.

Even if the joining portion between the electrode 33 and the corresponding electrode 23 is pushed out in the surface direction of the joining surface, therefore, it is possible according to the second embodiment to suppress sandwiching the portion pushed out between the insulation layers 22 and 32. As a result, lowering of the yield caused by the chip peeling off can be suppressed.

Figure 12A:
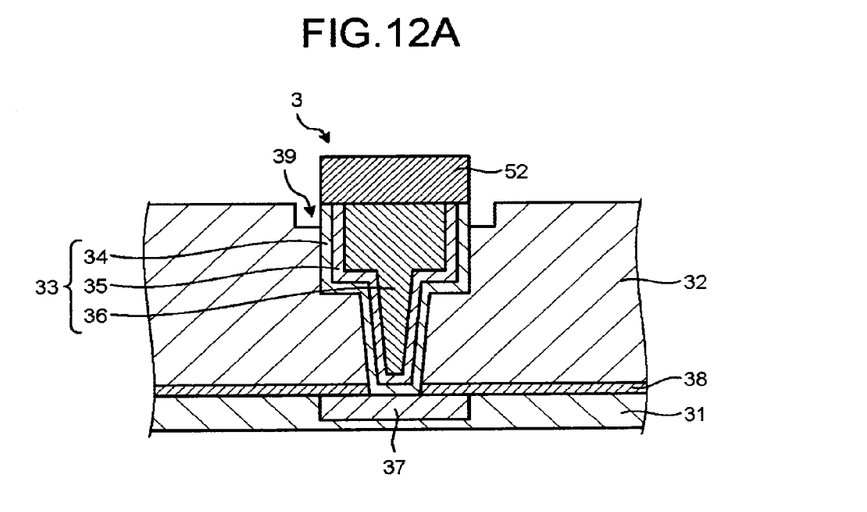
FIGS. 12A and 12B are explanation diagrams illustrating a manufacture process of the second chip according to the second embodiment.
Figure 12B:
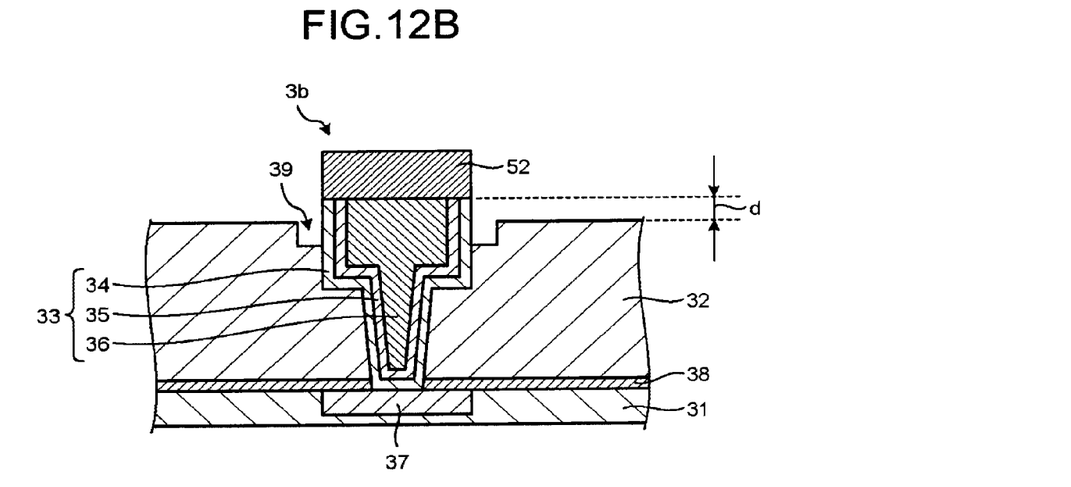
Figure 13:
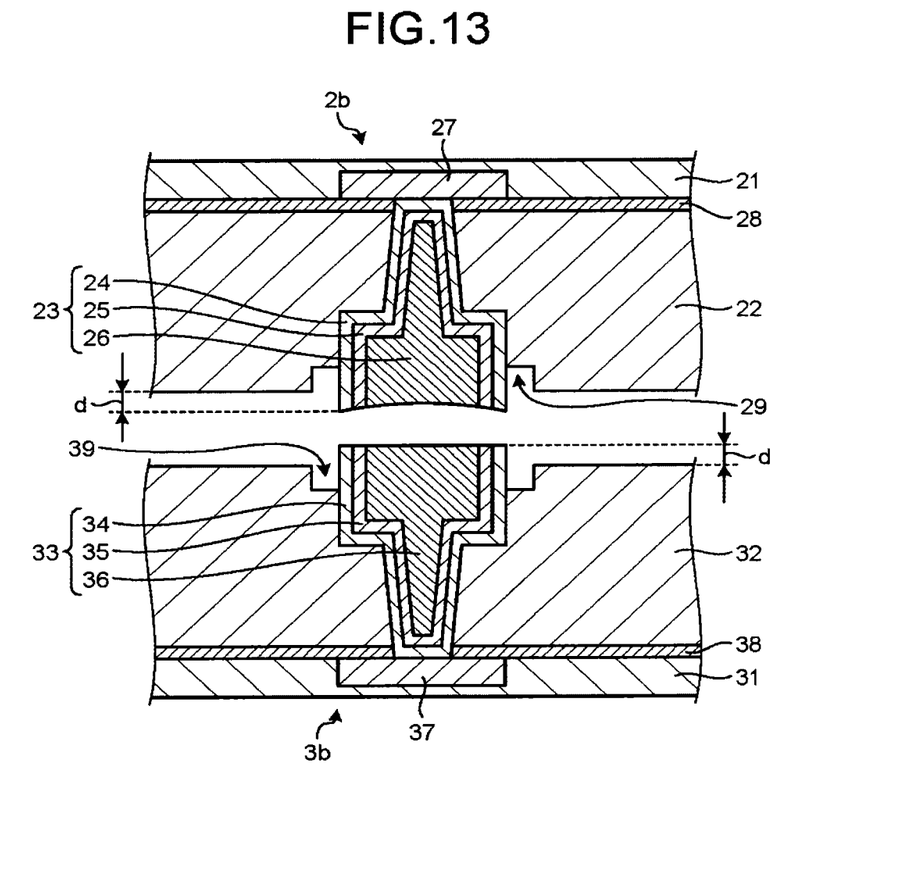
FIG. 13 is an explanation diagram illustrating schematic sectional views of a first chip and the second chip before sticking according to the second embodiment.

By the way, the method of protruding the sticking surface of the electrode 33 from the surface of the insulation layer 32 and forming the groove 39 around the electrode 33 is not restricted to the manufacture processes illustrated in FIGS. 12A and 12B. A different manufacture method of protruding the sticking surface of the electrode 33 from the surface of the insulation layer 32 and forming the groove 39 around the electrode 33 will now be described with reference to FIGS.

Figure 14A:
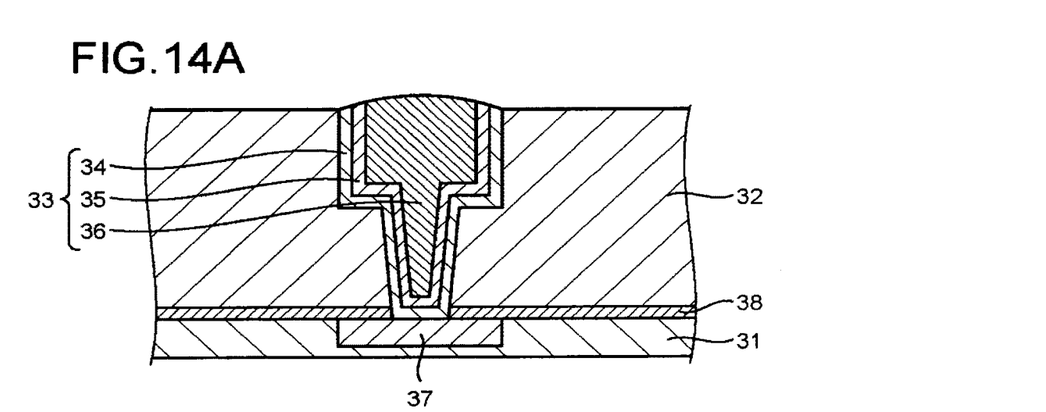
FIGS. 14A to 14C are explanation diagrams illustrating other manufacture processes according to the second embodiment.
Figure 14B:
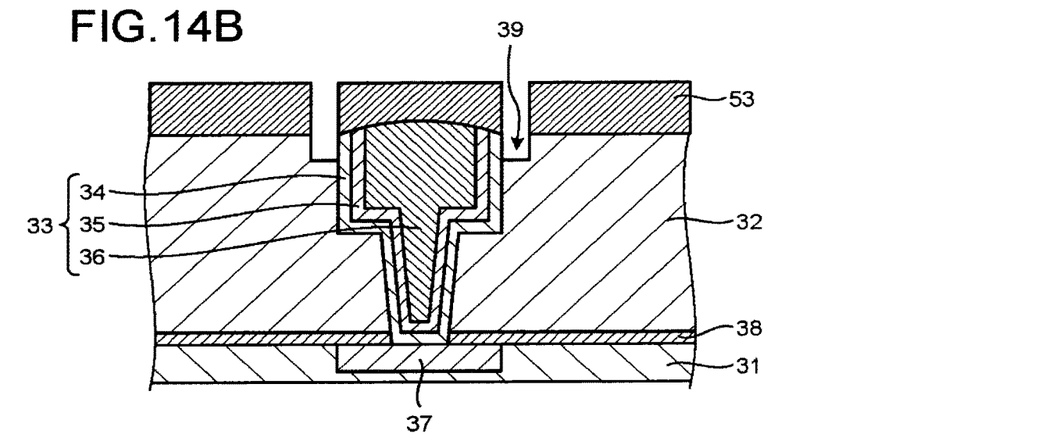
Figure 14C:
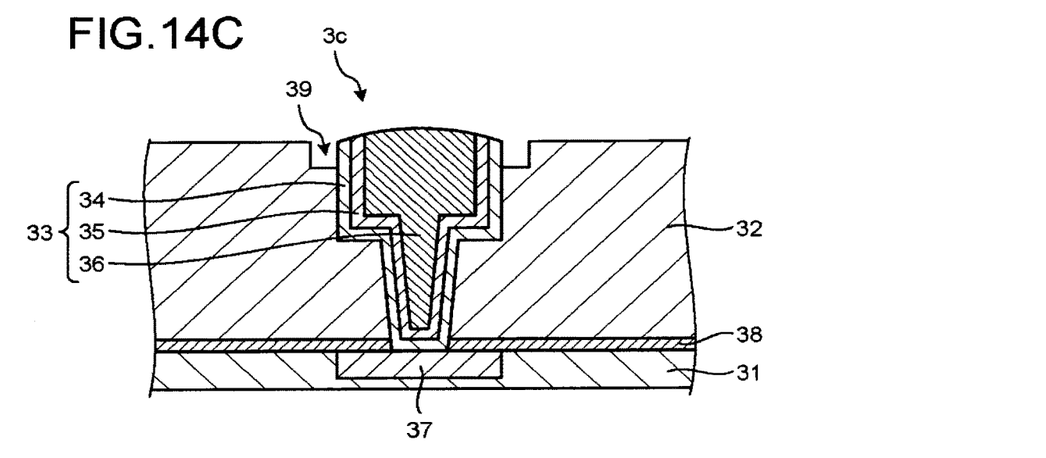

14A to 14C. FIGS. 14A to 14C are explanation diagrams illustrating different manufacture processes according to the second embodiment.

Among components of a second chip 3c illustrated in FIGS. 14A to 14C, components formed of the same materials as components in the second chip 3b illustrated in FIG. 12B and having the same functions are provided with the same reference numerals as those in FIG. 12B, and description of them will be omitted.

In the different manufacture method, the composition of a slurry for polishing is adjusted to polish the insulation layer excessively as compared with the electrode 33 when polishing the surfaces of the insulation layer 32 and the electrode 33. As a result, the electrode 33 after the polishing is brought into a state in which the electrode 33 protrudes from the surface of the insulation layer 32 as illustrated in FIG. 14A.

Subsequently, as illustrated in FIG. 14B, a resist 53 is formed on the top surface of the insulation layer 32 and a top surface of the electrode 33 except the forming position of the groove 39. Etching is conducted by using the resist 53 as a mask. As a result, the groove 39 is formed.

Then, the second chip 3c in which the first end surface of the electrode 33 which becomes a sticking surface protrudes from the surface of the insulation layer 32 can be manufactured by removing the resist 53 as illustrated in FIG. 14C. By the way, in a case of condition that the insulation layer 32 is selectively etched, it is not necessary to form the resist 53 on the electrode 33.

According to the different manufacture method, it is possible to manufacture the second chip 3c in which the sticking surface of the electrode 33 protrudes from the surface of the insulation layer 32 and the groove 39 is included, without conducting etching to cause the sticking surface of the insulation layer 32 to retreat.

According to the second embodiment, it is possible to provide the second chip 3c in which the sticking surface of the electrode 33 protrudes from the surface of the insulation layer 32 and the groove 39 is included, as described above. According to the second embodiment, it becomes possible to connect the electrode 33 to the corresponding electrode 23 suitably even in a case where a hollow occurs in a sticking surface of the electrode 33 in the second chip 3b or 3c and the corresponding electrode 23 in the first chip 2b. As a result, it is possible to suppress lowering of the yield caused by inferior connection.

By the way, in the first and second embodiments, the case where both sticking surfaces of two chips to be stuck together have grooves has been described. However, the groove may be provided on a sticking surface of at least one chip. If a groove is provided on one chip, the groove becomes a refuge of the joining portion of the electrode pushed out. If the joining portion of the electrode pushed out is comparatively small, therefore, the yield can be improved in the same way as the first and second embodiments.

Furthermore, in the second embodiment, the case where both electrodes in the two chips to be stuck together are protruded from the insulation layer has been described. However, the electrode may be protruded from the insulation layer in at least one chip. Even in such a configuration, it is possible to connect electrodes in two chips to be stuck, with sufficient suitableness.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    an insulation layer provided on a surface of a substrate;
    an electrode buried in the insulation layer and having a first end surface exposed from the insulation layer;
    a groove formed on the surface of the substrate around the electrode;
    a different substrate stuck to the substrate via the insulation layer;
    an insulation layer provided on a sticking surface of the different substrate; and
    a corresponding electrode buried in the insulation layer of the different substrate in a position corresponding to the electrode and having a first end surface exposed from a surface of the insulation layer of the different substrate, wherein
    the electrode and the corresponding electrode are connected in a state in which the electrode and the corresponding electrode are deviated in a surface direction of the joining surface, and
    there is an air gap between an unconnected portion of the electrode surface and a surface of the insulation layer in which the corresponding electrode is provided and between an unconnected portion of the corresponding electrode surface and a surface of the insulation layer in which the electrode is provided.

2. The semiconductor device according to claim 1, wherein the groove has an outside surface of the electrode as one side surface, and the groove is opened on a surface side of the insulation layer.

3. The semiconductor device according to claim 1, wherein the first end surface of the electrode is located above a surface of the insulation layer.

4. The semiconductor device according to claim 1, further comprising:
    a groove that has an outside surface of the corresponding electrode as one side surface, that is opened on a surface side of the insulation layer in which the corresponding electrode is buried, and that surrounds the corresponding electrode.

5. The semiconductor device according to claim 1, wherein the first end surface of the corresponding electrode is located above a surface of the insulation layer provided on the sticking surface on the different substrate.

6. The semiconductor device according to claim 1, wherein
    the substrate comprises a logic circuit, and
    the different substrate comprises an image sensor.

7. The semiconductor device according to claim 1, wherein
    the substrate comprises a logic circuit, and
    the different substrate comprises a memory.

8. A semiconductor device comprising:
    a first wiring line;
    a second wiring line;
    an insulation film including:
        a first surface that is parallel to a first direction;
        a second surface that is positioned closer to the second wiring line than the first surface in a second direction toward the second wiring line from the first wiring line, the second direction being perpendicular to the first direction, and is parallel to the first direction;

a third surface that is positioned closer to the second wiring line than the second surface. and is parallel to the first direction; and a fourth surface that is positioned closer to the second wiring line than the third surface, and is parallel to the first direction; and an electrode that contacts with the first and fourth surfaces, and electrically connects the first wiring line with the second wiring line, wherein an air gap is included between the second and third surfaces.

9. The semiconductor device according to claim 8, wherein the second and third surfaces are opposed to each other while having a predetermined distance therebetween in the second direction.

10. The semiconductor device according to claim 8,
wherein a part of the electrode protrudes in the first direction between the second and the third surfaces.

11. The semiconductor device according to claim 10, wherein a part of the second surface and a part of the third surface are opposed to each other while having a predetermined distance therebetween in the second direction.

\* \* \* \* \*